United States Patent
Wenzel

(10) Patent No.: US 9,748,168 B2
(45) Date of Patent: Aug. 29, 2017

(54) SUBSTRATE WITH ROUTING

(71) Applicant: FREESCALE SEMICONDUCTOR, INC., Austin, TX (US)

(72) Inventor: Robert J. Wenzel, Austin, TX (US)

(73) Assignee: NXP USA, Inc., Austin, TX (US)

( * ) Notice: Subject to any disclaimer, the term of this patent is extended or adjusted under 35 U.S.C. 154(b) by 27 days.

(21) Appl. No.: 14/926,749

(22) Filed: Oct. 29, 2015

(65) Prior Publication Data

US 2017/0125336 A1    May 4, 2017

(51) Int. Cl.
| | |
|---|---|
| *H05K 1/09* | (2006.01) |
| *H05K 1/11* | (2006.01) |
| *H01L 23/498* | (2006.01) |
| *H01L 21/48* | (2006.01) |

(52) U.S. Cl.
CPC .... *H01L 23/49844* (2013.01); *H01L 21/4853* (2013.01)

(58) Field of Classification Search
CPC ......... H05K 1/0245; H05K 2201/0919; H05K 2201/09236; H05K 2201/09263; H05K 2201/09636; H05K 2201/09672
See application file for complete search history.

(56) References Cited

U.S. PATENT DOCUMENTS

| | | | | |
|---|---|---|---|---|
| 6,235,997 | B1* | 5/2001 | Asada | H01L 23/49838 174/260 |
| 7,069,646 | B2* | 7/2006 | Duxbury | H05K 1/115 174/261 |
| 8,110,500 | B2 | 2/2012 | Mutnury et al. | |
| 8,402,406 | B2 | 3/2013 | Cases et al. | |
| 2004/0253825 | A1* | 12/2004 | Kawabata | H01L 21/4846 257/E23.062 |
| 2005/0077977 | A1* | 4/2005 | Beale | H01P 3/02 333/5 |
| 2006/0237222 | A1* | 10/2006 | Hosomi | H01L 23/66 174/255 |
| 2009/0051015 | A1* | 2/2009 | Ohsaka | H01L 23/66 174/261 |
| 2012/0243184 | A1* | 9/2012 | Lee | H05K 1/0245 174/251 |
| 2014/0326489 | A1 | 11/2014 | Mutnury et al. | |

* cited by examiner

*Primary Examiner* — Chau N Nguyen
*Assistant Examiner* — Roshn Varghese

(57) ABSTRACT

A substrate having an edge; a first and second active trace, wherein the first active trace corresponds to a first signal of a differential pair and the second active trace corresponds to a second signal of the differential pair; and a first and second conductive via which are located at different distances from the edge. The first active trace is routed to the first conductive via, and the second active trace is routed around the first conductive via to the second conductive via such that the second active trace is between the first conductive via and the edge. The substrate includes a first plating trace in electrical contact with the first active trace, and a second plating trace in electrical contact with the second active trace, wherein the first and second plating traces are routed to the edge on different metal layers of the substrate.

19 Claims, 4 Drawing Sheets

SUBSTRATE WITH ROUTING

BACKGROUND

Field

This disclosure relates generally to substrates for use in supporting semiconductors, and more specifically, to routing of conductive lines in such substrates.

Related Art

Some types of packaged semiconductor devices include a semiconductor device mounted on a package substrate. Routing of conductive lines is a significant function of the substrate. For example, a fan-out function is a common purpose of the substrate. The electrical connections are spread sufficiently so that efficient and reliable mounting to a printed circuit board or other surface can be achieved. The functions of a such a substrate include all aspects of making the semiconductor device more usable. This often relates to convenience of mounting but can also relate to functionality and performance of the semiconductor device.

Accordingly, there is a need for a further improvement in addressing one or more of the issues noted above regarding a substrate for use in having a semiconductor device mounted thereon.

FIG. 5, a prior art figure showing a capability of the prior art, is a top view of a substrate 500 having an edge 502 with plurality of vias, traces, and lines extending to edge 502. In particular a trace 504 extends near edge 502, and a line 506 extends from trace 504 to edge 502. Trace 504 extends to a region between a via 508 and edge 502. Trace 504 further extends inward to a via 512. Via 508 is an outer via in that it is near edge 502 and is contacted by a trace 510 that runs to an inner region of substrate 500. The vias near edge 502 also have a line extending to the edge 502. An example of this is a via 514 that has a trace 516 that is connected to it and that extends to edge 502. Because trace 504 is between via 508 and edge 502, the connection to edge 502 is made with a trace that contacts via 508 and is on the bottom surface. This trace is not shown in FIG. 5, and other outer vias not showing traces connected to an edge in FIG. 5 also have traces along the bottom surface to an edge.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, a substrate has conductive lines running to outer vias along the perimeter of the substrate and inner vias adjacent to the outer vias. A pair of vias that are for carrying signals that are a differential pair are adjacent to each other. One of the pair of vias is an inner via and the other is an outer via. A routing line, which runs to the inner via of the adjacent pair on a top surface of the substrate, is routed between the outer via of the adjacent pair and an outer edge of the substrate. The routing line thus has a portion which is near the edge of the substrate. A plating trace for use in plating the routing line and inner via runs from the routing line to the edge of the substrate from the portion of the routing line near the edge of the substrate. A plating trace for use in plating the outer via runs from the outer via to the edge along a bottom surface of the substrate. This provides for relatively short plating traces for the differential pair.

Figure 1:
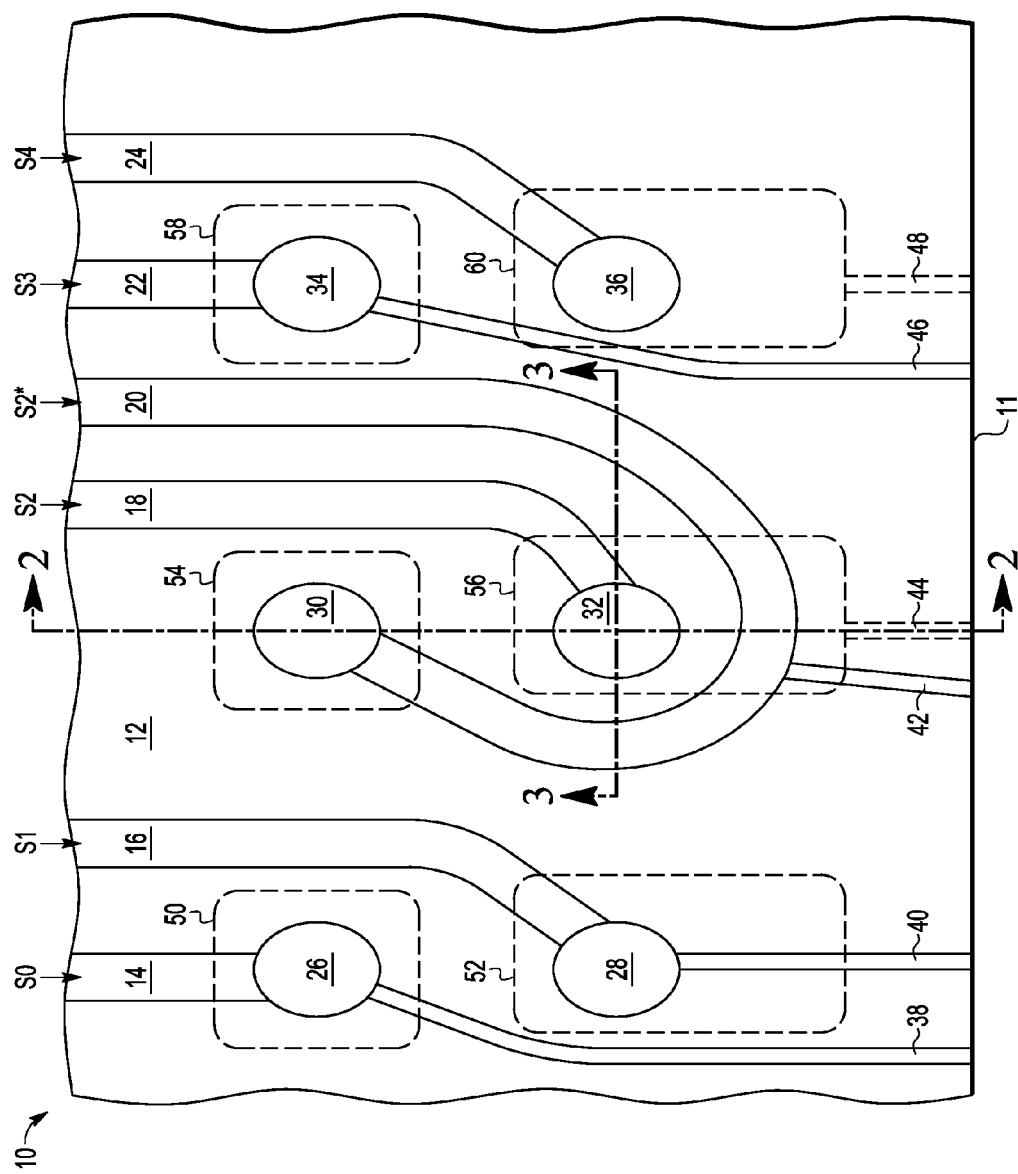
FIG. 1 is a top view of a portion of a substrate.

Shown in FIG. 1 is a substrate 10 having a dielectric 12 with active traces 14, 16, 18, 20, 22, and 24; plating traces 38, 40, 42, 44, 46, and 48; conductive pads 50, 52, 54, 56, 58, and 60; and vias 26, 28, 30, 32, 34, and 36. Substrate 10 has an edge 11. Conductive pads commonly include solder for ease in making electrical contact with another substrate and may be referenced as solder pads. Plating traces are used for receiving a necessary voltage during the plating of all of the traces. Shown in FIG. 1 is a top view which in this case is the surface on which would be mounted the integrated circuit or circuits. The designation of top or bottom is, however, arbitrary. Active traces 14, 16, 22, and 24 are for signals S0, S1, S3, and S4, respectively, which may be signals that are not part of a differential pair. Active traces 18 and 20 are for a differential pair of signals S2 and S2*, respectively. A differential pair describes the case where the voltage difference between the two signals is the significant quantity. In these cases it is important that the conditions seen by the two signals be as much the same as is reasonably possible. Any difference that can be eliminated should be pursued. For example, the lines of a differential pair should have the same resistance per unit distance, have the same capacitance, and traverse the same distance. To the extent that the two lines are the same, they will thereby experience substantially the same noise, attenuation, and delay so that the differential remains substantially unaffected. Thus the more the lines are the same, the less adverse will be the impact of noise, attenuation, and delay.

Active traces 14, 16, 18, 20, 22, and 24 are connected to vias 26, 28, 30, 32, 34, and 36, respectively, on the top surface. The physical connections herein result in electrical contact. Vias 26, 28, 30, 32, 34, and 36 extend from the top surface to the bottom surface. Conductive pads 50, 52, 54, 56, 58, and 60 are on the bottom surface and contact vias 26, 28, 30, 32, 34, and 36, respectively. Plating traces 38, 40, 42, 44, 46, and 48 extend to edge 11 and are connected to conductive pads 50, 52, 54, 56, 58, and 60, respectively. Plating traces 44 and 48 are on the bottom surface and plating traces 38, 40, 42, and 46 are on the top surface. Active trace 18 is between active trace 20 and via 30 as it extends to via 32. Active trace 20 extends past via 32, between via 32 and edge 11, and then back up to via 30. In the portion shown, active trace 20 is longer than trace 18, but choices are available for trace 18, such as where it begins or making several sharp turns to add length, not shown in FIG. 1 so that active traces 18 and 20 would have substantially the same overall length. The short distance of plating trace 42 due to extending active trace 20 near edge 11 improves the performance of differential pair S2 and S2* by reducing differential insertion loss and differential return loss. This benefit exceeds any detriment of this extending of the length of active trace 20.

Figure 2:
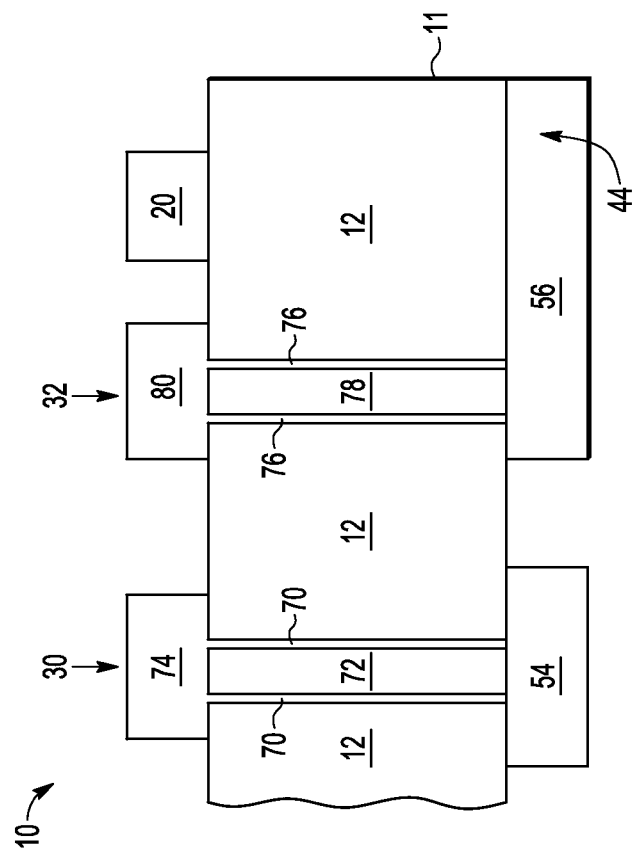
FIG. 2 is a cross sectional view of a portion of the substrate.

Shown in FIG. 2 is the cross section 2-2 of FIG. 1 showing dielectric 12, via 30, via 32, active trace 20, conductive pad 54, conductive pad 56, and plating trace 44. Via 30 includes a conductive pad 74 on the top surface and a conductive liner 70 and inner insulator 72 extending from conductive pad 74 to conductive pad 54 on the bottom surface. Via 32 includes a conductive pad 80 on the top surface and a conductive liner 76 and inner insulator 78 extending from conductive pad to conductive pad 56. There may be cases where a liner is not necessary and both conductive liner 76 and insulator 78 are replaced with a single conductive plug. Trace 44 would not be visibly different from conductive pad 56 in FIG. 2 except the dotted lines shows where trace 44 extends from conductive pad 56 to edge 11.

Figure 3:
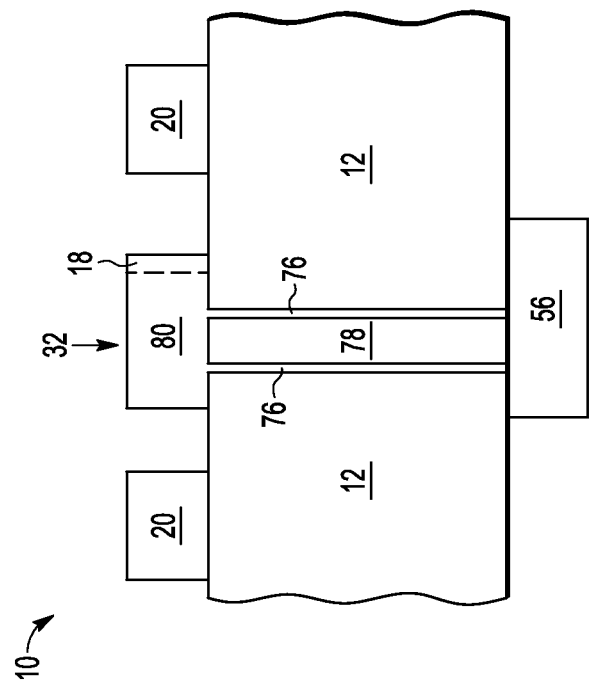
FIG. 3 is a cross sectional view of another portion of the substrate.

Shown in FIG. 3 is the cross section 3-3 of FIG. 1 showing dielectric 12, via 32, active trace 20, conductive pad 56 on the bottom of substrate 10, and a portion of active line 18 extending from conductive pad 80. This shows that by going around via 32, which in this case is nearly encircling via 32, active line 20 shows being on both sides of via 32 in this cross section. It is desirable to have at least 50% encirclement but even less may be beneficial.

Figure 4:
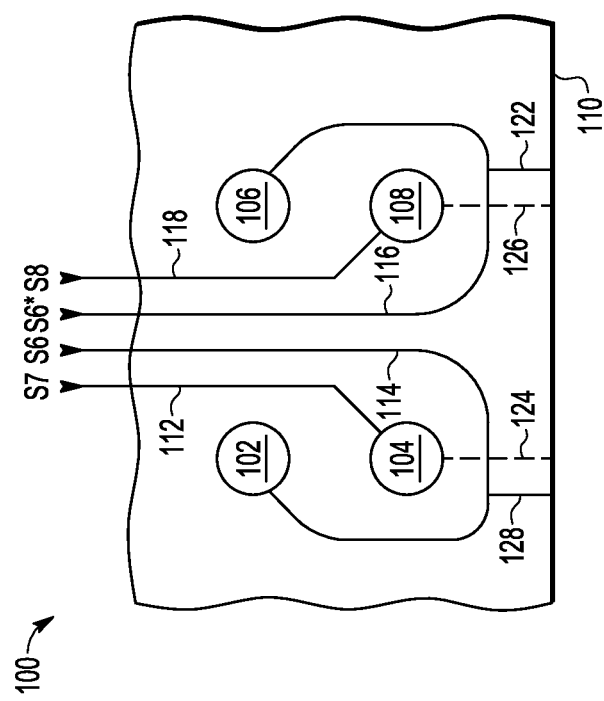
FIG. 4 is a top view of another portion of a substrate.
Figure 5:
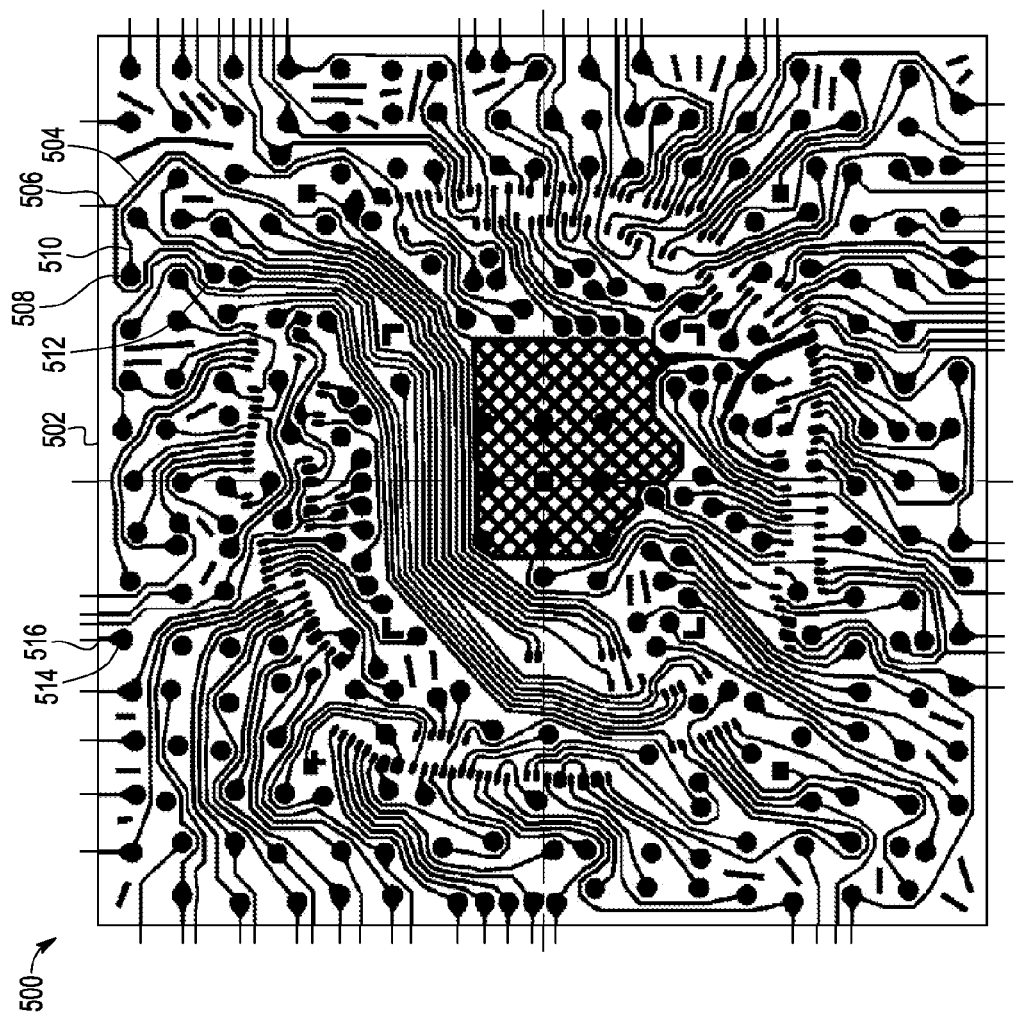
FIG. 5 is a prior art figure showing a top view of a substrate that demonstrates a capability of the prior art.

Shown in FIG. 4 is a simplified top view of a substrate 100 for a similar but alternative approach to that of substrate 10 comprising vias 104 and 108 adjacent to an edge 110 of substrate 100 and vias 102 and 106 adjacent to vias 104 and 108 respectively in which vias 104 and 108 are between edge 110 and vias 102 and 106. Substrate 100 further includes active lines 112, 114, 116, and 118 connected to vias 104, 102, 106, and 108, respectively. Active lines 112 and 118 carry signals S7 and S8, respectively, and active lines 114 and 116 carry signals S6 and S6*, respectively. Signals S7 and S8 are not a differential pair as shown but could be if the lines 112 and 118 were on the bottom of substrate 110. They could also be closer together. Signals S6 and S6* are a differential pair. Because S7 and S8 are adjacent to each other and the same distance from edge 110 on the outer row of vias, the row closest to edge 110 they much the same characteristics as a differential pair except there are lines 114 and 116 between them. Vias 102 and 106 are side by side and can thus be considered a pair side by side. Differential pair S6 and S6* are adjacent to each other, the same distance from edge 110 on an inner row of vias and thus also side by side. Differential pair S6 and S6* are spaced inward from vias 104 and 108 shown as being adjacent to vias 104 and 108 but could be on a row further inward. Active lines 114 and 116 run the same way as line 20 of FIGS. 1-3. Active line 114 runs adjacent to line 112 until line 112 connects to via 104, then runs between via 104 and edge 110, and then runs on the other side of via 104 until it contacts via 102. Similarly, active line 116 runs adjacent to line 118 until line 118 connects to via 108, then runs between via 108 and edge 110, and then runs on the other side of via 108 until it contacts via 106. This a symmetrical layout which tends to make the layout process more efficient. Further, if there is space available on the bottom of substrate 110 where lines 112 and 118 can run in the same manner as shown or even closer together, pair of vias 104 and 108 would be suitable for receiving a differential pair of signals.

A plating trace 124 extends from edge 110 to via 104 on the bottom side of substrate 100 in the same manner as plating trace 44 extends from edge 11 to via 32 as shown in FIGS. 1 and 2. A plating trace 128 extends from edge 110 to active line 114 in the same manner as plating trace 42 extends from edge 11 to active line 20 in FIG. 1. Plating traces 126 and 122 similarly extend from edge 110 to vias 108 and active line 116, respectively. The same approach of FIGS. 1-3 can thus be used in two side by side differential pairs.

Thus it is seen that shortening of the plating trace can be achieved beneficially in a differential pair situation, whether side by side or different distances from the edge, in which the active trace of one or both of the transistors of the differential extends down past a via adjacent to the edge and back up to the via to which it is to be connected while the plating trace contacts the active trace near the edge.

By now it is apparent there has been disclosed a substrate having an edge. The substrate includes a first active trace and a second active trace, wherein the first active trace corresponds to a first signal of a differential pair and the second active trace corresponds to a second signal of the differential pair. The substrate further includes a first conductive via and a second conductive via, wherein the first and the second conductive vias are located at different distances from the edge of the substrate, wherein the first active trace is routed to the first conductive via, and the second active trace is routed around the first conductive via to the second conductive via such that the second active trace is between the first conductive via and the edge of the substrate. The substrate further includes a first plating trace in electrical contact with the first active trace. The substrate further includes a second plating trace in electrical contact with the second active trace, wherein the first and second plating traces are routed to the edge of the substrate on different metal layers of the substrate. The substrate may have a further characterization by which the first and second active traces are located in a first metal layer of the substrate and substrate may further include a first solder pad located in a second metal layer of the substrate and attached to the first conductive via, wherein the first plating trace is in the second metal layer of the substrate and attached to the first solder pad. The substrate may further include a second solder pad located in the second metal layer and attached to the second conductive via, wherein the second plating trace is in the first metal layer of the substrate and attached to the second active trace. The substrate may have a further characterization by which the first conductive via is between the second conductive via and the edge of the substrate. The substrate may have a further characterization by which the second plating trace has a length that is shorter than a distance between the second conductive via and the edge of substrate. The substrate may have a further characterization by which the first plating trace is routed from the first conductive via to the edge of substrate. The substrate may have a further characterization by which the first plating trace is located at one of a top surface or a bottom surface of the substrate and second plating trace is located at another one of the top surface or bottom surface of the substrate. The substrate may have a further characterization by which the first plating trace is located at one of a top surface or a bottom surface of the substrate and the second plating trace is located at another one of the top surface or bottom surface of the substrate. The substrate may have a further characterization by which the second active trace surrounds at least 50% of a circumference of the first conductive via.

Disclosed also is a substrate having an edge. The substrate further includes a first active trace and a second active trace, wherein the first active trace corresponds to a first signal of a differential pair and the second active trace corresponds to a second signal of the differential pair. The substrate further includes a first conductive via, wherein the first active trace is routed around a second conductive via to the first conductive via such that the first active trace is between the second conductive via and the edge of the substrate. The substrate further includes a third active trace routed to the second conductive via. The substrate further includes a third conductive via, wherein the second active trace is routed around a fourth conductive via to the third conductive via such that the second active trace is between the fourth conductive via and the edge of the substrate. The substrate further includes a fourth active trace routed to the fourth conductive via. The substrate further includes a first plating trace in electrical contact with the first active trace. The substrate further includes include a second plating trace in electrical contact with the third active trace, wherein the first and second plating traces are routed to the edge of the substrate on different metal layers of the substrate. The substrate may further include a third plating trace in electrical contact with the second active trace and a fourth plating trace in electrical contact with the fourth active trace, wherein the third and fourth plating traces are routed to the edge of the substrate on different metal layers of the substrate. The substrate may have a further characterization by which the first plating trace and the third plating trace is located at one of a top surface or a bottom surface of the substrate and the second plating trace and the fourth plating trace is located at another one of the top surface or bottom surface of the substrate. The substrate may further include a bond pad at the bottom surface of the substrate in contact with each of the first, second, third, and fourth conductive vias. The substrate may have a further characterization by which the first plating trace is located at one of a top surface or a bottom surface of the substrate and the second plating trace is located at another one of the top surface or bottom surface of the substrate. The substrate may have a further characterization by which the second conductive via is closer to the edge of the substrate than the first conductive via, and the fourth conductive via is closer to the edge of the substrate than the third conductive via. The substrate may have a further characterization by which the third active trace corresponds to a first signal of a second differential pair and the fourth active trace corresponds to a second signal of the second differential pair. The substrate may have a further characterization by which the first active trace surrounds at least 50% of a circumference of the second conductive via and the second active trace surrounds at least 50% of a circumference of the fourth conductive via.

Also disclosed is a method for forming a substrate having an edge. The method further includes forming a first active trace and a second active trace, wherein the first active trace corresponds to a first signal of a differential pair and the second active trace corresponds to a second signal of the differential pair. The method further includes forming a first conductive via located at a first distance from the edge of the substrate. The method further includes routing a first active trace to the first conductive via, wherein the first active trace corresponds to a first signal of a differential pair. The method further includes forming a second conductive via located at a second distance from the edge, different from the first distance. The method further includes routing a second active trace to the second conductive via, wherein the second active trace corresponds to a second signal of the differential pair, and wherein the second active trace is routed around the first conductive via to the second conductive via such that the second active trace is between the first conductive via and the edge of the substrate. The method further includes forming a first plating trace in electrical contact with the first active trace. The method further includes forming a second plating trace in electrical contact with the second active trace, wherein the first and second plating traces are routed to the edge of the substrate on different metal layers of the substrate. The method may have further characterization by which forming the first plating trace includes forming the first plating trace on one of a top surface or bottom surface of the substrate and forming the second plating trace comprises forming the second plating trace on another one of the top surface or bottom surface of the substrate. The method may have further characterization by which forming the second active trace comprises forming the second active trace such that the second active trace surrounds at least 50% of a circumference of the first conductive via.

Although the disclosure is described herein with reference to specific embodiments, various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure. For example, the approach described can be extended to any number of differential pairs. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A substrate having an edge, the substrate comprising:
   a first active trace and a second active trace, wherein the first active trace corresponds to a first signal of a differential pair and the second active trace corresponds to a second signal of the differential pair;
   a first conductive via and a second conductive via, wherein the first and the second conductive vias are located at different distances from the edge of the substrate, wherein the first active trace is routed to the first conductive via, and the second active trace is routed around the first conductive via to the second conductive via such that the second active trace is between the first conductive via and the edge of the substrate, wherein the first conductive via is between the second conductive via and the edge of the substrate; and
   a first plating trace in electrical contact with the first active trace; and
   a second plating trace in electrical contact with the second active trace, wherein the first and second plating traces are routed to the edge of the substrate on different metal layers of the substrate.

2. The substrate of claim 1, wherein the first and second active traces are located in a first metal layer of the substrate, the substrate further comprising:
   a first solder pad located in a second metal layer of the substrate and attached to the first conductive via, wherein the first plating trace is in the second metal layer of the substrate and attached to the first solder pad.

3. The substrate of claim 2, wherein the substrate further comprises:
a second solder pad located in the second metal layer and attached to the second conductive via, wherein the second plating trace is in the first metal layer of the substrate and attached to the second active trace.

4. The substrate of claim 1, wherein the first conductive via is directly between the second conductive via and the edge of the substrate.

5. The substrate of claim 1, wherein the second plating trace has a length that is shorter than a distance between the second conductive via and the edge of substrate.

6. The substrate of claim 5, wherein the first plating trace is routed from the first conductive via to the edge of substrate.

7. The substrate of claim 6, wherein the first plating trace is located at one of a top surface or a bottom surface of the substrate and the second plating trace is located at another one of the top surface or bottom surface of the substrate.

8. The substrate of claim 1, wherein the first plating trace is located at one of a top surface or a bottom surface of the substrate and the second plating trace is located at another one of the top surface or bottom surface of the substrate.

9. The substrate of claim 1, wherein the second active trace surrounds at least 50% of a circumference of the first conductive via.

10. A substrate having an edge, the substrate comprising:
a first active trace and a second active trace, wherein the first active trace corresponds to a first signal of a differential pair and the second active trace corresponds to a second signal of the differential pair;
a first conductive via, wherein the first active trace is routed around a second conductive via to the first conductive via such that the first active trace is between the second conductive via and the edge of the substrate;
a third active trace routed to the second conductive via;
a third conductive via, wherein the second active trace is routed around a fourth conductive via to the third conductive via such that the second active trace is between the fourth conductive via and the edge of the substrate, wherein the second conductive via is closer to the edge of the substrate than the first conductive via, and the fourth conductive via is closer to the edge of the substrate than the third conductive via;
a fourth active trace routed to the fourth conductive via;
a first plating trace in electrical contact with the first active trace; and
a second plating trace in electrical contact with the third active trace, wherein the first and second plating traces are routed to the edge of the substrate on different metal layers of the substrate.

11. The substrate of claim 10, further comprising:
a third plating trace in electrical contact with the second active trace; and
a fourth plating trace in electrical contact with the fourth active trace, wherein the third and fourth plating traces are routed to the edge of the substrate on different metal layers of the substrate.

12. The substrate of claim 11, wherein the first plating trace and the third plating trace is located at one of a top surface or a bottom surface of the substrate and the second plating trace and the fourth plating trace is located at another one of the top surface or bottom surface of the substrate.

13. The substrate of claim 12, further comprising a bond pad at the bottom surface of the substrate in contact with each of the first, second, third, and fourth conductive vias.

14. The substrate of claim 10, wherein the first plating trace is located at one of a top surface or a bottom surface of the substrate and the second plating trace is located at another one of the top surface or bottom surface of the substrate.

15. The substrate of claim 10, wherein the third active trace corresponds to a first signal of a second differential pair and the fourth active trace corresponds to a second signal of the second differential pair.

16. The substrate of claim 10, wherein the first active trace surrounds at least 50% of a circumference of the second conductive via and the second active trace surrounds at least 50% of a circumference of the fourth conductive via.

17. A method for forming a substrate having an edge, the method comprising:
forming a first active trace and a second active trace, wherein the first active trace corresponds to a first signal of a differential pair and the second active trace corresponds to a second signal of the differential pair;
forming a first conductive via located at a first distance from the edge of the substrate;
routing a first active trace to the first conductive via, wherein the first active trace corresponds to a first signal of a differential pair;
forming a second conductive via located at a second distance from the edge, different from the first distance;
routing a second active trace to the second conductive via, wherein the second active trace corresponds to a second signal of the differential pair, and wherein the second active trace is routed around the first conductive via to the second conductive via such that the second active trace is between the first conductive via and the edge of the substrate, wherein the first conductive via is closer to the edge of the substrate than the second conductive via;
forming a first plating trace in electrical contact with the first active trace; and
forming a second plating trace in electrical contact with the second active trace, wherein the first and second plating traces are routed to the edge of the substrate on different metal layers of the substrate.

18. The method of claim 17, wherein forming the first plating trace comprises forming the first plating trace on one of a top surface or bottom surface of the substrate and forming the second plating trace comprises forming the second plating trace on another one of the top surface or bottom surface of the substrate.

19. The substrate of claim 17, wherein forming the second active trace comprises forming the second active trace such that the second active trace surrounds at least 50% of a circumference of the first conductive via.

* * * * *